(12) United States Patent
Usher

(10) Patent No.: US 10,824,388 B2
(45) Date of Patent: *Nov. 3, 2020

(54) ROBUST VOICE ACTIVITY DETECTOR SYSTEM FOR USE WITH AN EARPHONE

(71) Applicant: Staton Techiya, LLC, Delray Beach, FL (US)

(72) Inventor: John Usher, Beer (GB)

(73) Assignee: Staton Techiya, LLC, Delray Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/227,695

(22) Filed: Dec. 20, 2018

(65) Prior Publication Data

US 2019/0146747 A1    May 16, 2019

Related U.S. Application Data

(63) Continuation of application No. 14/922,475, filed on Oct. 26, 2015, now Pat. No. 10,163,453.

(60) Provisional application No. 62/068,273, filed on Oct. 24, 2014.

(51) Int. Cl.
| | |
|---|---|
| *G06F 3/16* | (2006.01) |
| *G10L 25/78* | (2013.01) |
| *H03G 3/34* | (2006.01) |
| *G10L 21/034* | (2013.01) |
| *G10L 15/22* | (2006.01) |
| *H04R 1/40* | (2006.01) |
| *H04R 3/00* | (2006.01) |

(Continued)

(52) U.S. Cl.
CPC .............. *G06F 3/165* (2013.01); *G10L 15/22* (2013.01); *G10L 21/034* (2013.01); *G10L 25/78* (2013.01); *H03G 3/341* (2013.01); *H04R 1/406* (2013.01); *H04R 3/005* (2013.01); *H04R 1/1083* (2013.01); *H04R 29/006* (2013.01)

(58) Field of Classification Search
CPC ................. G10L 21/0208; G10L 15/20; G10L 2021/02165; G10L 2021/02166
See application file for complete search history.

(56) References Cited

U.S. PATENT DOCUMENTS

| | | |
|---|---|---|
| 5,459,814 A | 10/1995 | Gupta et al. |
| 5,533,133 A | 7/1996 | Lamkin et al. |
| 6,088,670 A | 7/2000 | Takada |

(Continued)

*Primary Examiner* — Richemond Dorvil
*Assistant Examiner* — Mark Villena
(74) *Attorney, Agent, or Firm* — Akerman LLP; Peter A. Chiabotti; Mammen (Roy) P. Zachariah, Jr.

(57) ABSTRACT

An electronic device or method for adjusting a gain on a voice operated control system can include one or more processors and a memory having computer instructions. The instructions, when executed by the one or more processors causes the one or more processors to perform the operations of receiving a first microphone signal, receiving a second microphone signal, updating a slow time weighted ratio of the filtered first and second signals, and updating a fast time weighted ratio of the filtered first and second signals. The one or more processors can further perform the operations of calculating an absolute difference between the fast time weighted ratio and the slow time weighted ratio, comparing the absolute difference with a threshold, and increasing the gain when the absolute difference is greater than the threshold. Other embodiments are disclosed.

20 Claims, 3 Drawing Sheets

20
Exemplary method for determining voice activity status

(51) Int. Cl.
*H04R 29/00* (2006.01)
*H04R 1/10* (2006.01)

(56) References Cited

U.S. PATENT DOCUMENTS

| | | |
|---|---|---|
| 7,756,281 B2 | 7/2010 | Goldstein et al. |
| 8,047,207 B2 | 11/2011 | Perez et al. |
| 8,194,864 B2 | 6/2012 | Goldstein et al. |
| 8,199,919 B2 | 6/2012 | Goldstein et al. |
| 8,208,644 B2 | 6/2012 | Goldstein et al. |
| 8,208,652 B2 | 6/2012 | Keady |
| 8,221,861 B2 | 7/2012 | Keady |
| 8,229,128 B2 | 7/2012 | Keady |
| 8,251,925 B2 | 8/2012 | Keady et al. |
| 8,312,960 B2 | 11/2012 | Keady |
| 8,437,480 B2 * | 5/2013 | Zong ............... H03G 9/02 381/71.11 |
| 8,437,492 B2 | 5/2013 | Goldstein et al. |
| 8,550,206 B2 | 10/2013 | Keady et al. |
| 8,554,350 B2 | 10/2013 | Keady et al. |
| 8,600,067 B2 | 12/2013 | Usher et al. |
| 8,631,801 B2 | 1/2014 | Keady |
| 8,657,064 B2 | 2/2014 | Staab et al. |
| 8,678,011 B2 | 3/2014 | Goldstein et al. |
| 8,718,313 B2 | 5/2014 | Keady |
| 8,848,939 B2 | 9/2014 | Keady et al. |
| 8,917,880 B2 | 12/2014 | Goldstein et al. |
| 8,935,164 B2 | 1/2015 | Turnbull et al. |
| 8,992,710 B2 | 3/2015 | Keady |
| 9,113,267 B2 | 8/2015 | Usher et al. |
| 9,123,323 B2 | 9/2015 | Keady |
| 9,138,353 B2 | 9/2015 | Keady |
| 9,185,481 B2 | 11/2015 | Goldstein et al. |
| 9,216,237 B2 | 12/2015 | Keady |
| 9,539,147 B2 | 1/2017 | Keady et al. |
| 9,757,069 B2 | 9/2017 | Keady et al. |
| 9,781,530 B2 | 10/2017 | Usher et al. |
| 9,843,854 B2 | 12/2017 | Keady |
| 10,012,529 B2 | 7/2018 | Goldstein et al. |
| 10,190,904 B2 | 1/2019 | Goldstein et al. |
| 2003/0012388 A1 | 1/2003 | Ura |
| 2003/0055636 A1 | 3/2003 | Katuo et al. |
| 2006/0020451 A1 | 1/2006 | Kushner et al. |
| 2007/0126503 A1 | 6/2007 | Hsieh et al. |
| 2007/0276657 A1 | 11/2007 | Gournay et al. |
| 2009/0010444 A1 | 1/2009 | Goldstein et al. |
| 2009/0016541 A1 | 1/2009 | Goldstein et al. |
| 2009/0071487 A1 | 3/2009 | Keady |
| 2010/0086141 A1 * | 4/2010 | Nicolino, Jr. ............ H04R 5/04 381/57 |
| 2010/0241256 A1 | 9/2010 | Goldstein et al. |
| 2011/0035213 A1 | 2/2011 | Malenovsky et al. |
| 2012/0123772 A1 | 5/2012 | Thyssen et al. |
| 2012/0310637 A1 | 12/2012 | Vitte et al. |
| 2013/0013304 A1 | 1/2013 | Murthy et al. |
| 2013/0024194 A1 | 1/2013 | Zhao et al. |
| 2013/0098706 A1 | 4/2013 | Keady |
| 2013/0149192 A1 | 6/2013 | Keady |
| 2013/0188796 A1 | 7/2013 | Kristensen et al. |
| 2013/0272540 A1 | 10/2013 | Aahgren et al. |
| 2013/0297305 A1 | 11/2013 | Turnbull et al. |
| 2013/0329912 A1 | 12/2013 | Krishnaswamy et al. |
| 2014/0003644 A1 | 1/2014 | Keady et al. |
| 2014/0026665 A1 | 1/2014 | Keady |
| 2014/0093094 A1 | 4/2014 | Goldstein et al. |
| 2014/0188467 A1 | 7/2014 | Zing et al. |
| 2014/0278389 A1 | 9/2014 | Zurek et al. |
| 2014/0286497 A1 | 9/2014 | Thyssen et al. |
| 2014/0316774 A1 | 10/2014 | Wang |
| 2014/0341380 A1 | 11/2014 | Zheng et al. |
| 2014/0373854 A1 | 12/2014 | Keady |
| 2015/0163602 A1 | 6/2015 | Pedersen et al. |
| 2015/0221322 A1 | 8/2015 | Iyengar et al. |
| 2015/0228293 A1 | 8/2015 | Gunawan et al. |
| 2015/0243300 A1 | 8/2015 | Muesch |
| 2016/0015568 A1 | 1/2016 | Keady |
| 2016/0049915 A1 * | 2/2016 | Wang ............... H03G 7/002 381/107 |
| 2016/0155448 A1 | 6/2016 | Pumhagen et al. |
| 2016/0192077 A1 | 6/2016 | Keady |
| 2016/0295311 A1 | 10/2016 | Keady et al. |
| 2017/0134865 A1 | 5/2017 | Goldstein et al. |
| 2018/0054668 A1 | 2/2018 | Keady |
| 2018/0132048 A1 | 5/2018 | Usher et al. |
| 2018/0220239 A1 | 8/2018 | Keady et al. |
| 2019/0082272 A9 | 3/2019 | Goldstein et al. |

\* cited by examiner

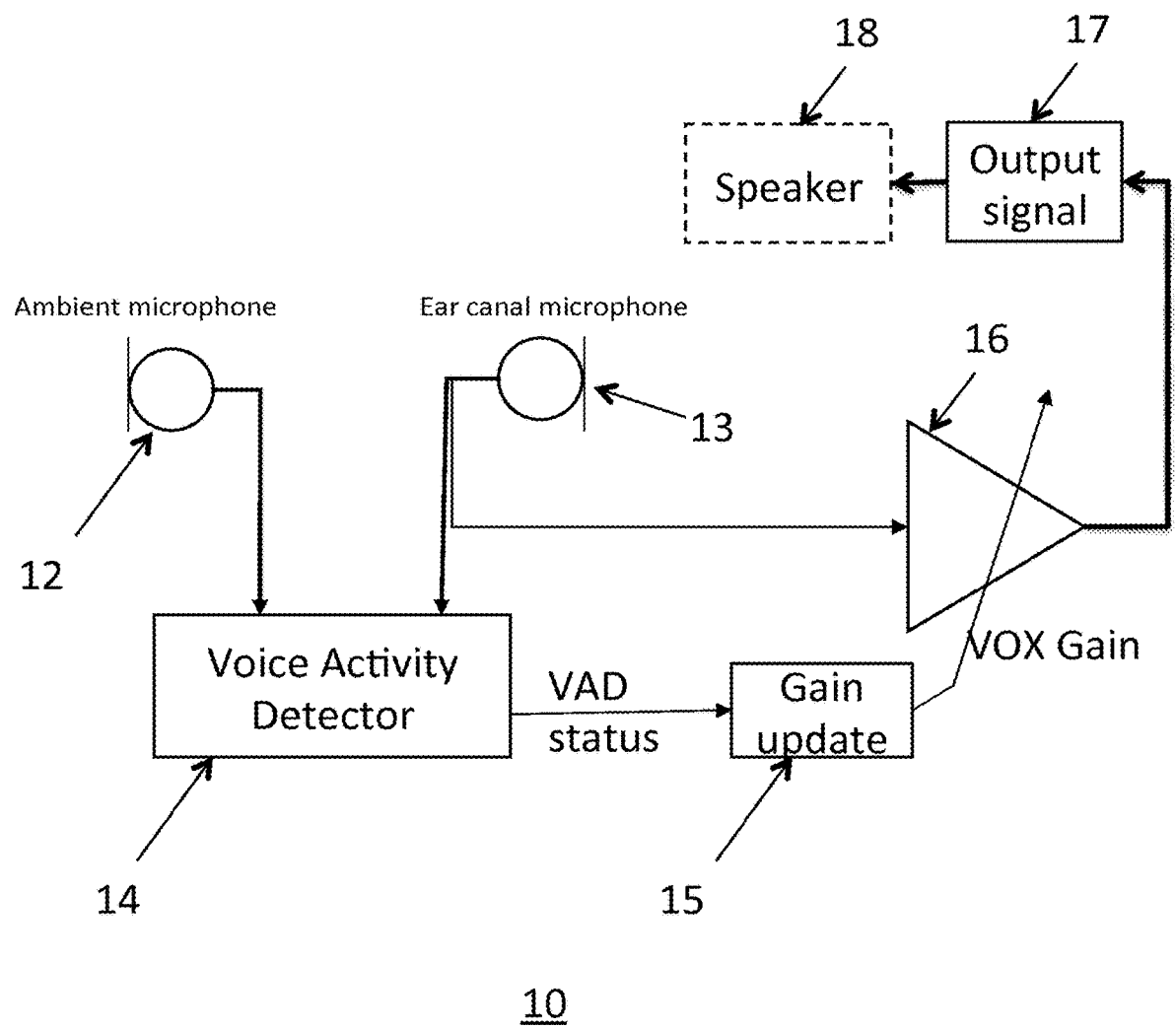
FIG. 1: Exemplary configuration of VAD system.

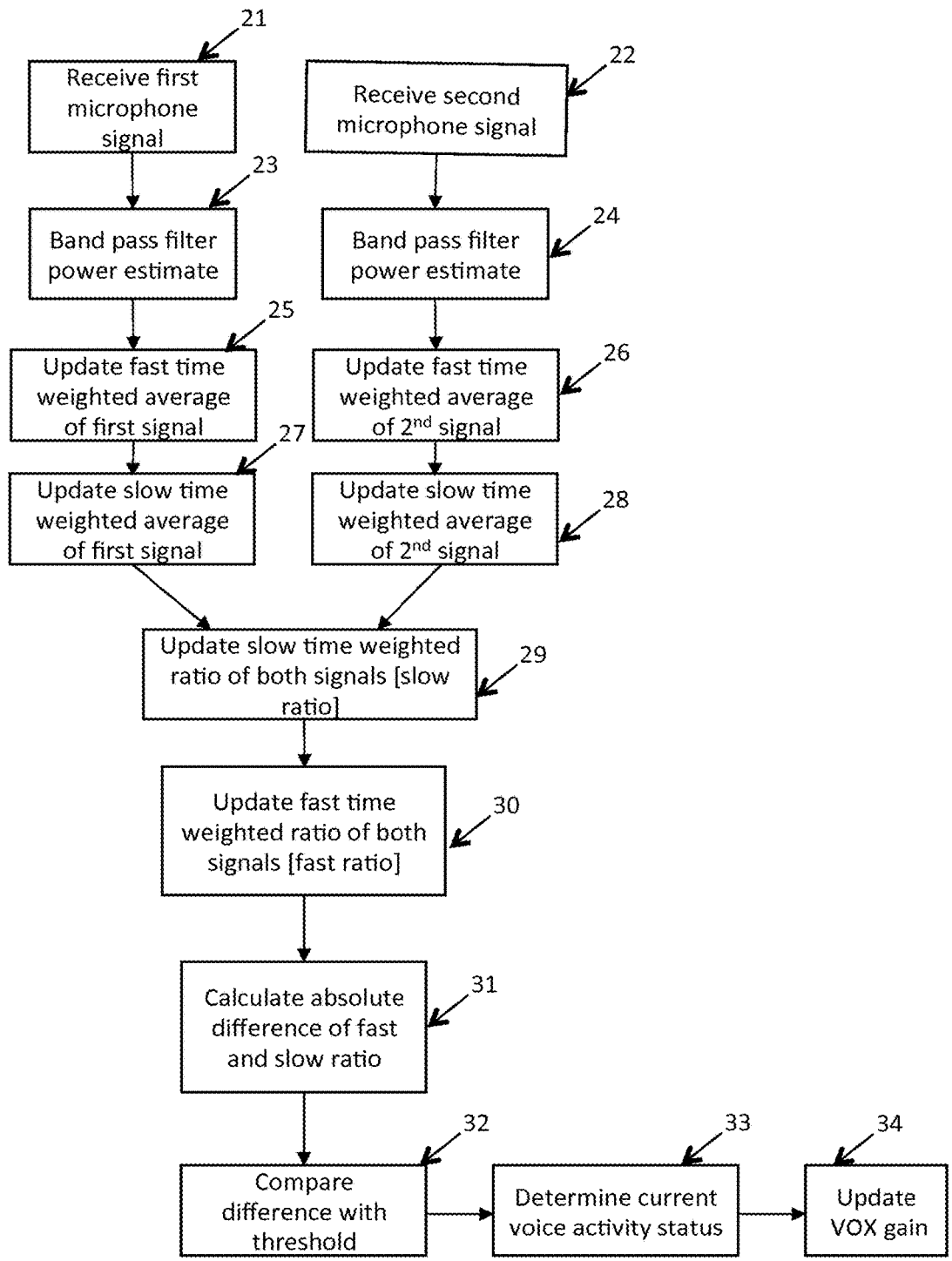
FIG. 2: Exemplary method for determining voice activity status

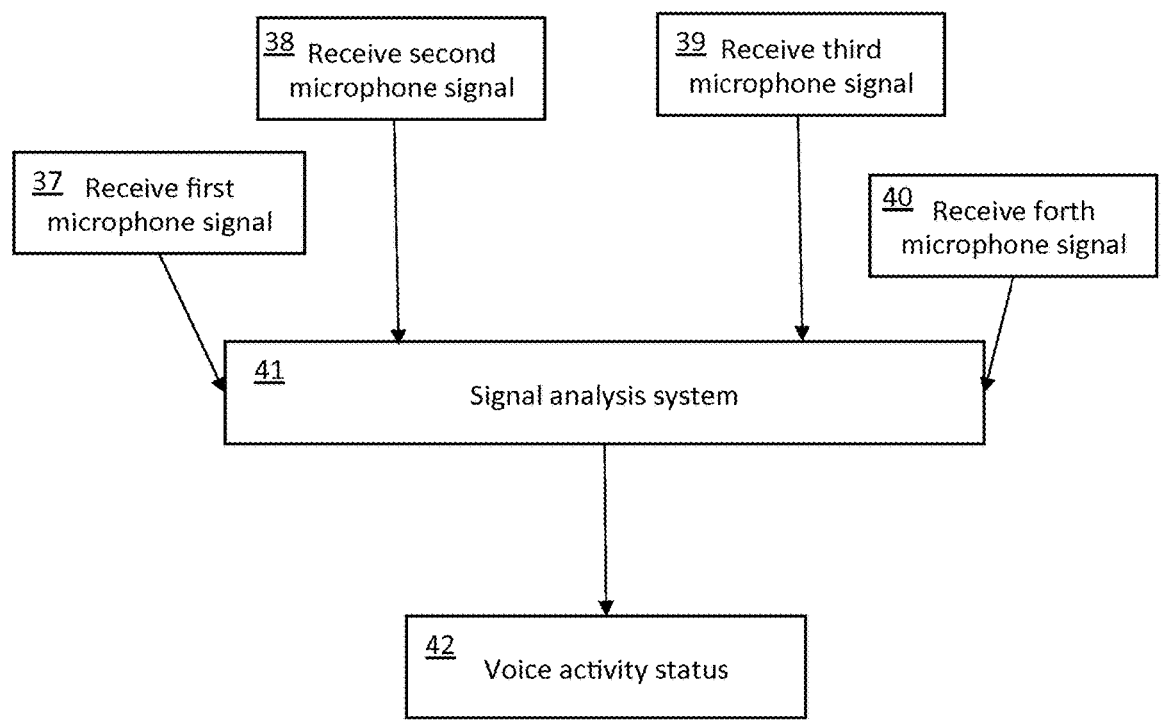
FIG. 3: Overview of system for determining voice activity status.

1

ROBUST VOICE ACTIVITY DETECTOR SYSTEM FOR USE WITH AN EARPHONE

CROSS-REFERENCE TO RELATED APPLICATION(S)

This application is a continuation of and claims priority to U.S. patent application Ser. No. 14/922,475, filed on Oct. 26, 2015, which claims priority to U.S. Provisional Patent Application No. 62/068,273, filed on Oct. 24, 2014, which are both hereby incorporated by reference in their entireties.

FIELD OF THE INVENTION

The present embodiments relate to detection of voice activity in noisy environments.

BACKGROUND OF THE INVENTION

Robust voice activity detection in noisy sound environments is a very difficult problem when using a small device mounted in the ear. Such systems that rely on using fixed thresholds often suffer from false positives and false negatives.

SUMMARY OF THE INVENTION

A method of adjusting a gain on a voice operated control system can include receiving a first microphone signal, receiving a second microphone signal, updating a slow time weighted ratio of the filtered first and second signals, and updating a fast time weighted ratio of the filtered first and second signals. The method can further include calculating an absolute difference between the fast time weighted ratio and the slow time weighted ratio, comparing the absolute difference with a threshold, and increasing the gain when the absolute difference is greater than the threshold. In some embodiments the threshold can be fixed. In some embodiments the method can further include band limiting or band pass filtering the first microphone signal to provide a filtered first signal, band limiting or band pass filtering the second microphone signal to provide a filtered second signal, calculating a power estimate of the filtered first signal including a fast time weighted average and a slow time weighted average of the filtered first signal, and calculating a power estimate of the filtered second signal including a fast time weighted average and a slow time weighed average of the filtered second signal. In some embodiments the threshold is dependent on the slow time weighted average. In some embodiments, the threshold value is set to a time averaged value of the absolute difference and in some embodiments the threshold value is set to the time averaged value of the absolute difference using a leaky integrator used for time smoothing. The step of band limiting or band pass filtering can use a weighted fast Fourier transform operation. In some embodiments, the method can further include determining a current voice activity status based on the comparison step. In some embodiments, the method can further include determining a current voice activity status using Singular Value Decomposition, a neural net system, or a bounded probability value.

The embodiments can also include an electronic device for adjusting a gain on a voice operated control system which can include one or more processors and a memory having computer instructions. The instructions, when executed by the one or more processors causes the one or more processors to perform the operations of receiving a first microphone signal, receiving a second microphone signal, updating a slow time weighted ratio of the filtered first and second signals, and updating a fast time weighted ratio of the filtered first and second signals. The one or more processors can further perform the operations of calculating an absolute difference between the fast time weighted ratio and the slow time weighted ratio, comparing the absolute difference with a threshold, and increasing the gain when the absolute difference is greater than the threshold. In some embodiments, adjusting or increasing the gain involves adjusting a gain of an overall system or of a total output. In some embodiments, adjusting the gain involves adjusting the gain from a first microphone, from a second microphone or from both. In some embodiments, adjusting the gain involves adjusting the gain at the output of a VAD or comparator or other output. In some embodiments, adjusting the gain can involve any combination of gain adjustment mentioned above.

In some embodiments, electronic device can further include the memory having instructions when executed by the one or more processors to cause the one or more processors to perform the operations of band limiting or band pass filtering the first microphone signal to provide filtered first signal, band limiting or band pass filtering the second microphone signal to provide a filtered second signal, calculating a power estimate of the filtered first signal including a fast time weighted average and a slow time weighted average of the filtered first signal, and calculating a power estimate of the filtered second signal including a fast time weighted average and a slow time weighed average of the filtered second signal. In some embodiments the threshold is fixed or the threshold is dependent on the slow time weighted average. In some embodiments, the first microphone signal is received by an ambient signal microphone and the second microphone signal is received by a ear canal microphone. The ambient signal microphone and the ear canal microphone can be part of an earphone device having a sound isolating barrier or a partially sound isolating barrier to isolate the ear canal microphone from an ambient environment. The earphone device can be any number of devices including, but not limited to a headset, earpiece, headphone, ear bud or other type of earphone device. In some embodiments, the sound isolating barrier or partially sound isolating barrier is an inflatable balloon or foam plug. In some embodiments, the memory further includes instructions causing the operation of determining a current voice activity status based on the comparison step. In some embodiments, the memory further includes instructions causing the operation of determining a current voice activity status using Singular Value Decomposition, neural net systems, or a bounded probability value. In some embodiments, the first microphone signal is optionally processed using an analog or a digital band-pass filter and in some embodiments the second microphone signal is optionally processed using an analog or a digital band-pass filter. In some embodiments, at least one characteristic of the first or second microphone signals includes a short-term power estimate.

BRIEF DESCRIPTION OF THE DRAWINGS

The invention may be understood from the following detailed description when read in connection with the accompanying drawing. It is emphasized, according to common practice, that various features of the drawings may not be drawn to scale. On the contrary, the dimensions of the various features may be arbitrarily expanded or reduced for clarity. Moreover, in the drawing, common numerical references are used to represent like features. Included in the drawing are the following figures:

FIG. 1 is a block diagram of a voice activity detector system in accordance with an embodiment;

FIG. 2 is a flow chart of a method for determining voice activity status in accordance with an embodiment herein; and FIG. 3 is an overview block diagram of a system for determining voice activity status in accordance with an embodiment herein.

DETAILED DESCRIPTION OF THE INVENTION

A new method and system is presented to robustly determined voice activity using typically two microphones mounted in a small earpiece. The determined voice activity status can be used to control the gain on a voice operated control system to gate the level of a signal directed to a second voice receiving system. This voice receiving system can be a voice communication system (eg radio or telephone system), a voice recording system, a speech to text system, a voice machine-control system. The gain of the voice operated control system is typically set to zero when no voice active is detected, and set to unity otherwise. The overall data rate in a voice communication system can therefore be adjusted, and large data rate reductions are possible: thereby increasing the number of voice communications channels and/or increasing the voice quality for each voice communication channel. The voice activity status can also be used to adjust the power used in a wireless voice communication system, thereby extending the battery life of the system.

FIG. 1 describes an exemplary overview or system 10 of an embodiment in accordance the present invention. In one exemplary embodiment, two microphones in an earphone are used to determine voice activity of the earphone wearer. The first microphone 12 is an ambient sound microphone, detecting sound in the ambient environment of the earphone wearer. The second microphone 13 is an ear-canal microphone detecting sound in the ear canal of the earphone wearer. In a preferred embodiment, the earphone incorporates a sound isolating or a partially sound isolating barrier to isolate the ear canal microphone from the ambient environment, where this barrier can be an inflatable balloon or foam plug. The microphones 12 and 13 can serve as inputs to a voice activity detector or VAD 14. The voice activity detector 14 can provide a VAD status to a gain update module 15. The gain update module 15 and the ear canal microphone 13 can provide inputs to an amplifier 16. The output from the gain update module 15 serves as the voice controller gain input signal to the amplifier 16. The amplifier 16 can provide an output signal 17 which can be used by a speaker 18 for example.

FIG. 2 describes a method 20 for determining the status of user voice activity of the earphone system in FIG. 1. The first and second microphone signals are received at 21 and 22 and are band pass filtered (or "band limited") and a power estimate of these filtered first and second microphone signals are calculated at 23 and 24 respectively. In the preferred embodiment, the band pass filtering is accomplished by a weighted FFT operation, familiar to those skilled in the art, with the signal power estimated between approximately 100 Hz and 2 kHz.

$$P\_1(t)=W*FFT(M\_1(t))$$

$$P\_2(t)=W*FFT(M\_2(t))$$

Where $P\_1(t)$ is the weighted power estimate of signal microphone 1 at time t.

W is a frequency weighting vector.

FFT( ) is a Fast Fourier Transform operation.

$M\_1(t)$ is the signal from the first microphone at time t.

$M\_2(t)$ is the signal from the second microphone at time t.

A fast-time weighted average of the two band pass filtered power estimates is calculated at 25 and 26 respectively, with a fast time constant which in the preferred embodiment is equal to 45 ms.

$$AV\_M1\_fast(t)=a*AV\_M1\_fast(t-1)+(a-1)*P\_1(t)$$

$$AV\_M2\_fast(t)=a*AV\_M2\_fast(t-1)+(a-1)*P\_1(t)$$

Where $AV\_M1\_fast(t)$ is the fast time weighted average of the first band pass filtered microphone signal.

$AV\_M2\_fast(t)$ is the fast time weighted average of the second band pass filtered microphone signal.

a is a fast time weighting coefficient.

A slow-time weighted average of the two band pass filtered power estimates is calculated at 27 and 28 respectively, with a fast time constant which in the preferred embodiment is equal to 500 ms.

$$AV\_M1\_slow(t)=b*AV\_M1\_slow(t-1)+(b-1)*P\_1(t)$$

$$AV\_M2\_slow(t)=b*AV\_M2\_slow(t-1)+(b-1)*P\_1(t)$$

Where $AV\_M1\_slow(t)$ is the slow time weighted average of the first band pass filtered microphone signal.

$AV\_M2\_slow(t)$ is the slow time weighted average of the second band pass filtered microphone signal.

b is a slow time weighting coefficient, where a>b.

The ratio of the two fast time weighted power estimates is calculated at 30 (i.e., the fast weighted power of the second microphone divided by the fast weighted power of the first microphone).

$$ratio\_fast(t)=AV\_M2\_fast(t)/AV\_M1\_fast(t)$$

The ratio of the two slow time weighted power estimates is calculated at 29 (ie the slow weighted power of the second microphone divided by the slow weighted power of the first microphone).

$$ratio\_slow(t)=AV\_M2\_slow(t)/AV\_M1\_slow(t)$$

The absolute difference of the two above ratio values is then calculated at 31.

$$diff(t)=abs(ratio\_fast(t)-ratio\_slow(t))$$

Note that the updating of the slow time weighted ratio in one embodiment is of the first filtered signal and the second filtered signal where the first filtered signal and the second filtered signal are the slow weighted powers of the first and second microphone signals. Similarly, updating of the fast time weighted ratio is of the first filtered signal and the second filtered signal where the first filtered signal and the second filtered signals are the fast weighted powers of the first and second microphone signals. As noted above, the absolute differences between the fast time weighted ratio and the slow time weighted ratios are calculated to provide a value.

This value is then compared with a threshold at 32, and if the value diff(t) is greater than this threshold, then we determine that voice activity is current in an active mode at

33, and the VOX gain value is updated at 34 or in this example increased (up to a maximum value of unity).

In one exemplary embodiment the threshold value is fixed.

In a second embodiment the threshold value is dependent on the slow weighted level AV_M1 slow.

In a third embodiment the threshold value is set to be equal to the time averaged value of the diff(t), for example calculated according to the following:

$$\text{threshold}(t) = c \cdot \text{threshold}(t-1) + (c-1) \cdot \text{diff}(t)$$

where c is a time smoothing coefficient such that the time smoothing is a leaky integrator type with a smoothing time of approximately 500 ms.

FIG. 3 is a diagram showing a high level overview of a system 35 to detect voice activity status. The system 35 uses a signal analysis system 41 to analyze at least 2 audio input signals (e.g., 37, 38, 39, and 40) to determine a voice activity status at 42, where this status can be a binary value (e.g., 0="no voice activity" and 1="voice activity", or the status can be a bounded probability value, e.g., between 0% and 100%, where the value is a probability likelihood of voice activity. The signal analysis system 41 can utilize the previously described method, where 2 input signals from a single earphone are used to determine a voice activity status. Alternative methods for determining voice activity can include algorithms using Singular Value Decomposition (SVD) or neural net systems.

Although the invention is illustrated and described herein with reference to specific embodiments, the invention is not intended to be limited to the details shown. Rather, various modifications may be made in the details within the scope and range of equivalents of the claims and without departing from the embodiments claimed.

I claim:

1. A method of adjusting a gain on a voice operated control system, comprising:
   determining a slow time weighted ratio of a filtered first microphone signal and a filtered second microphone signal;
   determining a fast time weighted ratio of the filtered first microphone signal and the filtered second microphone signal;
   comparing, with a threshold, an absolute difference between the fast time weighted ratio and the slow time weighted ratio; and
   increasing the gain on the voice operated control system when the absolute difference is greater than the threshold, wherein a voice activity status is utilized to control the gain on the voice operated control system and to adjust a level of a signal directed to a voice receiving system in communication with the voice operated control system.

2. The method of claim 1, further comprising receiving a first microphone signal and a second microphone signal.

3. The method of claim 2, further comprising filtering the first microphone signal to generate the filtered first microphone signal and filtering the second microphone signal to generate the filtered second microphone signal.

4. The method of claim 1, further comprising determining the voice activity status based on the comparing of the absolute difference.

5. The method of claim 1, further comprising updating the fast time weighted ratio, the slow time weighted ratio, or a combination thereof.

6. The method of claim 1, further comprising increasing the gain on the voice operated control system by adjusting a gain from a first microphone, adjusting a gain from a second microphone, or a combination thereof.

7. The method of claim 1, further comprising determining the voice activity status using singular value decomposition, a neural net system, a bounded probability value or a combination thereof.

8. The method of claim 1, further comprising generating the filtered first microphone signal and the filtered second microphone signal by band pass filtering first and second microphone signals respectively.

9. The method of claim 1, further comprising determining a power estimate of the filtered first microphone signal, the filtered second microphone signal, or a combination thereof.

10. The method of claim 1, further comprising setting the gain of the voice operated control system to zero when no voice activity is detected.

11. The method of claim 1, further comprising adjusting a data rate in the voice receiving system.

12. A device for adjusting a gain on a voice operated control system, comprising:
    a processor; and
    a memory having computer instructions, wherein the instructions, when executed by the processor, cause the processor to perform operations comprising:
      calculating a slow time weighted ratio of a filtered first microphone signal and a filtered second microphone signal;
      calculating a fast time weighted ratio of the filtered first microphone signal and the filtered second microphone signal;
      comparing, with a threshold, an absolute difference between the fast time weighted ratio and the slow time weighted ratio; and
      increasing the gain on the voice operated control system when the absolute difference is greater than the threshold, wherein a voice activity status is utilized to control the gain on the voice operated control system or to adjust a level of a signal directed to a voice receiving system in communication with the voice operated control system.

13. The device of claim 12, wherein the operations further comprise adjusting a power of the voice receiving system by utilizing the voice activity status.

14. The device of claim 12, wherein the operations further comprise determining the voice activity status by utilizing two microphones of the device.

15. The device of claim 12, wherein the operation further comprise reducing a data rate of the voice receiving system.

16. The device of claim 12, wherein the operations further comprise determining a power estimate of the filtered first microphone signal, the filtered second microphone signal, or a combination thereof.

17. The device of claim 12, wherein the operations further comprise calculating the fast time weighted ratio based on a fast time weighted average of the filtered first microphone signal that is calculated based on a fast time weighting coefficient that is greater than a slow time weighting coefficient utilized in a slow time weighted average of the filtered first microphone signal utilized in calculating the slow time weighted ratio.

18. The device of claim 12, wherein the operations further comprise calculating the absolute difference between the fast time weighted ratio and the slow time weighted ratio.

19. The device of claim 12, wherein the operations further comprise setting the gain of the voice operated control system to zero when no voice activity is detected.

20. A method of adjusting a gain on a voice operated control system, comprising:
- determining a slow time weighted ratio of a filtered first microphone signal and a filtered second microphone signal;
- determining a fast time weighted ratio of the filtered first microphone signal and the filtered second microphone signal;
- calculating an absolute difference between the fast time weighted ratio and the slow time weighted ratio; and
- increasing the gain on the voice operated control system when the absolute difference is greater than a threshold, wherein a voice activity status is utilized to control the gain on the voice operated control system and to adjust a level of a signal directed to a voice receiving system in communication with the voice operated control system.

\* \* \* \* \*